(12) United States Patent
Sinanoglu et al.

(10) Patent No.: US 8,006,150 B2
(45) Date of Patent: Aug. 23, 2011

(54) CIRCUIT AND METHOD FOR INCREASING SCAN CELL OBSERVABILITY OF RESPONSE COMPACTORS

(75) Inventors: Ozgur Sinanoglu, Safat (KW); Sobeeh A. Almukhaizim, Kuwait (KW)

(73) Assignee: Kuwait University, Safat (KW)

( * ) Notice: Subject to any disclaimer, the term of this patent is extended or adjusted under 35 U.S.C. 154(b) by 255 days.

(21) Appl. No.: 12/379,535

(22) Filed: Feb. 24, 2009

(65) Prior Publication Data
US 2010/0218061 A1    Aug. 26, 2010

(51) Int. Cl.
*G01R 31/28* (2006.01)
(52) U.S. Cl. .................. 714/726; 714/729; 714/731
(58) Field of Classification Search .................. None
See application file for complete search history.

(56) References Cited

U.S. PATENT DOCUMENTS

| | | | |
|---|---|---|---|
| 6,091,261 A * | 7/2000 | De Lange | 326/38 |
| 7,222,227 B2 | 5/2007 | Katayama et al. | |
| 7,222,277 B2 * | 5/2007 | Wang et al. | 714/726 |
| 7,313,746 B2 | 12/2007 | Chao et al. | |
| 7,376,875 B2 * | 5/2008 | Hilgendorf et al. | 714/734 |
| 7,395,473 B2 | 7/2008 | Cheng et al. | |
| 7,523,370 B1 * | 4/2009 | Keller | 714/726 |
| 7,610,527 B2 * | 10/2009 | Wang et al. | 714/724 |
| 7,734,973 B2 * | 6/2010 | Hiraide et al. | 714/729 |
| 7,797,603 B2 * | 9/2010 | Rajski et al. | 714/738 |
| 7,818,644 B2 * | 10/2010 | Rajski et al. | 714/732 |
| 2006/0101316 A1 * | 5/2006 | Wang et al. | 714/726 |
| 2007/0234150 A1 * | 10/2007 | Jain et al. | 714/726 |

OTHER PUBLICATIONS

Sinanoglu, O.; Almukhaizim, S., Sinanoglu, O. ; Almukhaizim, S. ; X-Align: Improving the Scan Cell Observability of Response Compactors, Mar. 16, 2009, IEEE Circuits and Systems Society, vol. 17 , Issue:10, pp. 1392-1404.*
X-Align: Improving the Scan Cell Observability of Response Compactors Ozgur Sinanoglu, Member, IEEE, and Sobeeh Almukhaizim, Member, IEEE Transactions on Very Large Scale Integration (VLSI) Systems, vol. 17, No. 10, Oct. 2009.*

* cited by examiner

*Primary Examiner* — Jeffrey A Gaffin
*Assistant Examiner* — Guerrier Merant
(74) *Attorney, Agent, or Firm* — Richard C. Litman (57) ABSTRACT

The circuit and method for increasing the scan cell observability of response compactors is based on manipulation of x distribution in responses prior to taking them through a compactor. An x-align block is capable of delaying scan chains by judiciously computed values, and thus aligning x's within the same slices. The x-alignment is effected in the insertion of proper control data to the generic x-align hardware. As a result, fewer scan cells are masked due to response x's into other cells, reflecting into enhanced test quality. An ILP formulation can be used to identify the delay assignment that leads to the maximum number of observable scan cells. Alternatively, a computationally efficient greedy heuristic can be used to attain near-optimal results in reasonable run-time. Thus, the x-align block enhances the effectiveness of response compactors and reaps high test quality, even in the dense presence of response x's.

10 Claims, 9 Drawing Sheets

| $S_0$ | $S_1$ | $S_2$ | $S_3$ | $S_4$ |
|---|---|---|---|---|
| 0 | X | 1 | X | 1 |
| 1 | 0 | X | 0 | X |
| X | 0 | 0 | X | 0 |
| 1 | 1 | 1 | 1 | X |

Fig. 5

| 0 | 0 | 1 | 0 | 1 | 0 | 0 |
|---|---|---|---|---|---|---|
| 0 | 0 | 0 | 1 | 0 | 1 | 0 |
| 0 | 1 | 0 | 0 | 1 | 0 | 0 |
| 0 | 0 | 0 | 0 | 0 | 1 | 0 |

Fig. 6

| $S_0$ | $S_1$ | $S_2$ | $S_3$ | $S_4$ | $S_5$ |
|---|---|---|---|---|---|
|  | 0 | X | 1 | X | 1 |
| 1 | 0 | X | 0 | X |  |
|  | X | 0 | 0 | X | 0 |
| 1 | 1 | 1 | 1 | X |  |

Fig. 7

| $P_x$ | $\Delta max = 0$ | $\Delta max = 1$ | | | | $\Delta max = 3$ | | | | $\Delta max = 7$ | | | |
|---|---|---|---|---|---|---|---|---|---|---|---|---|---|
| | $SC_{obs}$ | ILP | | GREEDY | | ILP | | GREEDY | | ILP | | GREEDY | |
| | | $SC_{obs}$ | TIME | $SC_{obs}$ | TIME | $SC_{obs}$ | TIME | $SC_{obs}$ | TIME | $SC_{obs}$ | TIME | $SC_{obs}$ | TIME |
| 0.005 | 920 | 940 | 1 | 940 | <1 | 940 | 1 | 940 | <1 | 942 | 1 | 940 | 1 |
| 0.01 | 860 | 900 | 1 | 880 | <1 | 920 | 1 | 920 | <1 | 940 | 1 | 920 | 1 |
| 0.025 | 660 | 720 | 2 | 700 | <1 | 772 | 114 | 756 | <1 | 829 | 736 | 772 | 1 |
| 0.05 | 460 | 580 | 9 | 543 | <1 | 674 | 534 | 611 | <1 | 735 | 3117 | 713 | 1 |
| 0.1 | 140 | 280 | 58 | 266 | <1 | NA | NA | 299 | <1 | NA | NA | 417 | 1 |
| 0.2 | 0 | NA | NA | 60 | <1 | NA | NA | 89 | <1 | NA | NA | 157 | 1 |
| 0.3 | 0 | NA | NA | 20 | <1 | NA | NA | 35 | <1 | NA | NA | 77 | 1 |

Fig. 8

| ARCH. | $P_x$ | $\Delta max = 0$ | RESPONSE SHAPER | X-ALIGN | | |
|---|---|---|---|---|---|---|
| | | | | $\Delta max = 1$ | $\Delta max = 3$ | $\Delta max = 7$ |
| 20x50 | 0.05 | 460 | 501 | 543 | 611 | 713 |
| | 0.1 | 140 | 201 | 266 | 299 | 417 |
| | 0.2 | 0 | 0 | 60 | 89 | 157 |
| | 0.3 | 0 | 0 | 20 | 35 | 77 |
| 50x200 | 0.05 | 700 | 851 | 1550 | 2112 | 2770 |
| | 0.1 | 100 | 151 | 300 | 475 | 980 |
| | 0.2 | 0 | 0 | 0 | 210 | 252 |
| | 0.3 | 0 | 0 | 0 | 55 | 133 |

*Fig. 9*

| ARCH. | $P_x$ | $\Delta max = 0$ | $\Delta max = 1$ | $\Delta max = 3$ | $\Delta max = 7$ |
|---|---|---|---|---|---|
| TWO NON-OVERLAPPING PARITY TREES | 0.05 | 2750 | 3409 | 4158 | 4323 |
| | 0.1 | 675 | 1261 | 1770 | 1957 |
| | 0.2 | 25 | 159 | 370 | 488 |
| | 0.3 | 0 | 50 | 136 | 144 |
| FOUR NON-OVERLAPPING PARITY TREES | 0.05 | 5339 | 5611 | 5932 | 6217 |
| | 0.1 | 2680 | 3194 | 3470 | 3886 |
| | 0.2 | 661 | 1017 | 1290 | 1517 |
| | 0.3 | 76 | 205 | 303 | 581 |
| EIGHT NON-OVERLAPPING PARITY TREES | 0.05 | 7225 | 7407 | 7580 | 7696 |
| | 0.1 | 5001 | 5388 | 5586 | 5821 |
| | 0.2 | 2388 | 2756 | 2977 | 3188 |
| | 0.3 | 798 | 1110 | 1325 | 1490 |
| EIGHT PARITY TREES (X-COMPACT) | 0.05 | 6935 | 6945 | 7142 | 7142 |
| | 0.1 | 3309 | 3467 | 3467 | 3979 |
| | 0.2 | 519 | 696 | 696 | 696 |
| | 0.3 | 0 | 52 | 136 | 217 |

| CIRCUIT | ONLY XOR TREE | | RESPONSE SHAPER | | X-ALIGN | | | | | |
|---|---|---|---|---|---|---|---|---|---|---|
| | TDV | AREA | TDV | AREA | Δmax = 1 | | Δmax = 3 | | Δmax = 7 | |
| | | | | | TDV | AREA | TDV | AREA | TDV | AREA |
| s35932 | 0.49% | 0.47% | 0.49% | 1.64% | 0.50% | 1.81% | 0.50% | 4.77% | 0.51% | 10.04% |
| s38417 | 0.51% | 0.55% | 0.52% | 1.92% | 0.52% | 2.12% | 0.53% | 5.60% | 0.53% | 11.77% |
| s38584 | 0.49% | 0.50% | 0.49% | 1.76% | 0.49% | 1.94% | 0.50% | 5.12% | 0.50% | 10.78% |

Fig. 12

| CIRCUIT | $P_x$ | ONLY XOR TREE | RESPONSE SHAPER | X-ALIGN | | |
|---|---|---|---|---|---|---|
| | | | | Δmax = 1 | Δmax = 3 | Δmax = 7 |
| s35932 | 0.05 | 39.06% | 41.06% | 44.92% | 48.10% | 53.56% |
| | 0.1 | 8.79% | 13.72% | 14.65% | 20.51% | 28.96% |
| | 0.2 | 1.95% | 2.98% | 5.22% | 6.35% | 11.18% |
| | 0.3 | 0.00% | 0.00% | 0.98% | 2.83% | 5.18% |
| s38417 | 0.05 | 39.04% | 42.54% | 45.24% | 56.54% | 59.76% |
| | 0.1 | 14.93% | 19.58% | 18.37% | 24.80% | 29.45% |
| | 0.2 | 1.15% | 2.35% | 3.79% | 7.63% | 9.13% |
| | 0.3 | 0.00% | 0.00% | 1.15% | 3.10% | 5.17% |
| s38584 | 0.05 | 39.31% | 41.68% | 51.45% | 51.73% | 57.57% |
| | 0.1 | 11.56% | 13.93% | 18.90% | 22.72% | 27.34% |
| | 0.2 | 1.16% | 2.37% | 3.47% | 4.62% | 7.92% |
| | 0.3 | 0.00% | 0.00% | 0.00% | 3.99% | 5.55% |

Fig. 13

| CIRCUIT | X RATIO | SINGLE PARITY TREE | | |
|---|---|---|---|---|
| | | Δmax = 0 | Δmax = 1 | Δmax = 3 |
| A 15669 BITS (80X196) | 0.11 | 2000 | 2440 (64s) | 2858 (131s) |
| | 0.14 | 1680 | 2080 (65s) | 2640 (131s) |
| | 0.15 | 1040 | 1600 (65s) | 1720 (133s) |
| B 22213 BITS (100X223) | 0.03 | 1500 | 2400 (142s) | 2525 (287s) |
| | 0.04 | 300 | 1064 (142s) | 1731 (286s) |
| | 0.08 | 0 | 0 (142s) | 54 (287s) |

Fig. 14A

| TWO PARITY TREES | | | FOUR PARITY TREES | | |
|---|---|---|---|---|---|
| Δmax = 0 | Δmax = 1 | Δmax = 3 | Δmax = 0 | Δmax = 1 | Δmax = 3 |
| 3400 | 3925 (66s) | 4251 (133s) | 5020 | 5488 (81s) | 5984 (163s) |
| 3280 | 3624 (66s) | 3990 (135s) | 5220 | 5452 (81s) | 6042 (163s) |
| 2120 | 2760 (65s) | 3091 (131s) | 4020 | 4586 (81s) | 5197 (163s) |
| 6200 | 7485 (143s) | 7957 (287s) | 11475 | 12097 (181s) | 12407 (363s) |
| 3000 | 3732 (146s) | 5118 (291s) | 7600 | 8642 (181s) | 9614 (363s) |
| 250 | 700 (145s) | 1030 (291s) | 2500 | 3093 (180s) | 3752 (363s) |

Fig. 14B

CIRCUIT AND METHOD FOR INCREASING SCAN CELL OBSERVABILITY OF RESPONSE COMPACTORS

BACKGROUND OF THE INVENTION

1. Field of the Invention

The present invention relates to integrated circuit chip-testing procedures, and particularly to a circuit and method for increasing scan cell observability of response compactors.

2. Description of the Related Art

While scan-based testing is widely adopted, a large number of scan cells coupled with a large set of scan patterns reflect into an inflated test data volume and prolonged test application time. To alleviate the associated test costs, test data compression solutions are employed.

In such a scheme, a few number of scan-in channels drive a larger number of internal scan chains through a decompression block, while the responses collected from the internal scan chains are taken through a compactor block that drives a fewer number of scan-out channels. Due to on-chip stimulus expansion on the input side and to on-chip response compaction on the output side, test data volume is reduced. Furthermore, driving a larger number of internal scan chains from a fewer number of scan channels reduces the depth of the scan chains, decreasing the number of shift (scan) operations per scan pattern, and hence shortening the test application time.

While response compaction reduces the size of expected vectors that need to be stored on tester memory, the consequent information loss inevitably reflects into loss in test quality. Certain errors that are observable in original scan responses may become unobserved in the compacted responses. Observability loss may be a consequence of multiple errors masking out the effect of each other, producing the expected values, or of the ambiguity induced by unknown response bits (x's) that may take on either binary value upon arbitrary initialization.

Uninitialized memory elements such as RAMs, multi-cycle paths or bus contentions in a design constitute potential sources for unknown values, which may propagate into a scan cell upon the application of a test pattern. These unknown response bits create a multiplicity of expected vectors, preventing an error from manifesting at the compactor outputs. A scan slice consists of one scan cell from each scan chain such that the distance of these scan cells to the scan-out pin of the associated chain are identical. Thus, the scan cells that are in the same scan slice with another scan cell that has captured an unknown bit may become unobservable when a response compactor is utilized.

Sequential circuitries, such as MISRs, can be utilized for compressing scan responses into a signature to be observed at the end of the test application process. Unknown response bits corrupt the MISR content, however, if they propagate into the MISR. The fact that a single x corrupts the MISR signature stems from the sequential nature of a MISR in accumulating its signature. An x-masking circuitry, capable of delivering per-scan or per-pattern replacement of response x's with known constant values based on control bits delivered from the ATE, can be utilized along with a MISR. In the presence of many unknown bits, however, their must-be-perfect masking may disable the observation of most of the scan cells, which is also referred to as over-masking, reducing the effectiveness of test patterns. Therefore, these selective masking approaches also incur area and test data volume overhead, wherein the magnitude of this overhead depends on the extent of the desired flexibility in masking scan chains and/or cycles.

Combinational, mostly XOR-based, solutions are therefore widely used for response compaction. Some of these techniques build the response compactor based on fault sensitization information under a particular fault model assumption while response unknown bit and unmodeled defect coverage issues are overlooked. Test set and fault model independent techniques have also been proposed. However, each one of these techniques bears a particular unknown bit resistance characteristic. The density and the distribution of unknown response bits determine the test quality delivered by these schemes.

The synthesis of the response compactor based on a given set of test patterns and, thus, the knowledge regarding the position of the unknown bits helps maximize scan cell observability. Design changes in the form of ECOs (Engineering Change Orders) late in the design cycle, however, doom this type of technique, as the design change necessitates regeneration of test patterns, and hence the re-synthesis of the compactor, which may not be afforded towards the end of a tape-out process.

A previously proposed technique, referred to as response shaper, is capable of delaying only a single selected scan chain by only one cycle, constituting a special case of the proposed x-align block. It has been shown that utilization of even a simple single-output XOR tree along with a response shaper outperforms other more complex response compactors, such as convolutional compactors.

With the recent trend of testing designs faster than at-speed, wherein small delay defects are targeted even on shorter paths, the test is applied at a frequency that exceeds the functional speed. A resulting problem is that timing exceptions are raised on the longer paths that cannot meet the set-up constraints, resulting in x-heavy test responses.

In fact, for an unknown-heavy design with a large number of scan chains, and/or with deep scan chains, the single-cycle-delay in a single-scan-chain capability falls short in delivering reasonable scan cell observability enhancements. While the selection of the only chain to be delayed constitutes a less challenging problem for which all possible solutions can be simply enumerated, further significant test quality enhancements can be reaped through the generalization of the challenging x-alignment problem.

Accordingly, a generic-hardware solution that is nevertheless capable of adapting to the distribution of unknown bits for any given set of scan patterns is the key to attaining heightened levels of test quality while delivering practicality. This adaptiveness can be achieved by exploiting the built-in reconfigurability of the generic hardware through the insertion of proper control bits. Manipulation of x distribution through such a reconfigurability alleviates the masking effect of x's. Thus, a circuit and method for increasing scan cell observability of response compactors solving the aforementioned problems is desired.

SUMMARY OF THE INVENTION

The circuit and method for increasing the scan cell observability of response compactors includes an x-align circuit inserted between the response compactor and a plurality of internal scan chains, the scan chains feeding into the x-align circuit, with additional inputs being control data. The x-align circuit receives the data from the internal scan chains and judiciously manipulates it based on the control data received from scan-in channels, prior to sending it to the response compactor.

The x-align circuit has a plurality of multiplexers, each of the scan chains having one of the multiplexers on its scan-out path. At least one delay register is interposed in each scan-out path between the scan chain and its corresponding multiplexer. Each delay register is capable of delaying the corresponding scan chain for one cycle, depending upon whether the delay register is enabled by the control data, so that each scan chain can be delayed for a number of cycles up to the number of delay registers interposed between the scan chain and its corresponding multiplexer.

At least one control register is connected to a respective multiplexer for determining how many delay registers are inserted or enabled in the particular scan chain. At least one control shift register is connected to the at least one control register for receiving the control data during the shift cycles and for updating the control register during the capture cycle, and a delay channel input is connected to the control shift register for serially controlling the control shift register. The delay channel input is directly controlled by the tester for loading the control data into the control shift registers. The control data is serially shifted into the control shift registers, and subsequently loaded into the control registers during the capture cycle. The same clock signal that drives the scan chain is provided to the delay registers associated with the particular scan chain as well.

The circuit further includes a global scan-enable signal and a reset input for the delay registers. The global scan-enable signal is for driving the reset input and for gating-off the clock input of the control registers and control shift registers.

The method includes an ILP formulation that is used to identify the delay assignment that leads to the maximum number of observable scan cells. Furthermore, a computationally efficient greedy heuristic is used to attain near-optimal results in a reasonable run-time. The X-align system can be geared towards aligning x's in the minimum number of scan slices, the minimum number of scan chains, or the minimum number of scan slices and chains, depending on the nature of the response compactor. Alignment of x's in the minimum number of scan chains can be achieved via a multiplexer-based circuitry, which can be configured with control data that is computed by ILP techniques.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
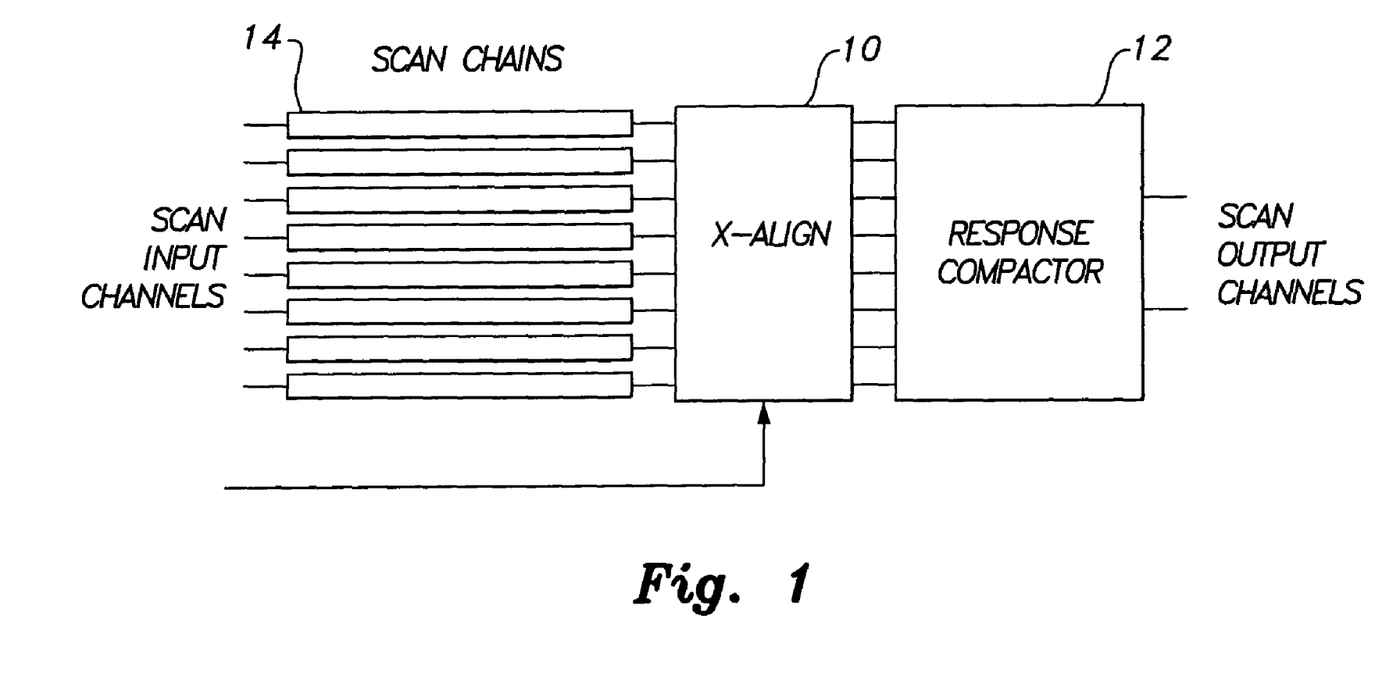
FIG. 1 is a block diagram of a scan architecture for testing integrated circuits that includes an x-align circuit for increasing scan cell observability of response compactors according to the present invention.

The present invention, as illustrated in FIG. 1, relates to a circuit or block, referred to as x-align block 10, that is utilized in conjunction with a response compactor 12 in order to enhance the scan cell observability of the compactor 12 in the testing of integrated circuit chips.

The x-align block 10 is inserted between internal scan chains 14 and the response compactor 12, and is used to judiciously manipulate scan responses prior to response compaction. Reconfigurability of the x-align block 10 allows for this manipulation, which is effected in a form of aligning unknown response bits within the same scan slices as much as possible. Thus, the x-align block 10 minimizes the number of slices with unknown bit(s), or equivalently, maximizes the number of slices in which all of the bits are in a known state.

The align operation is implemented with delay cells within the x-align block 10, whose length can be adjusted on a per scan chain per scan pattern basis by loading the x-align block 10 with proper control data. The x-align block 10 is fixed for a given design and is independent of any test set and any fault model. The x-align block 10 is immune to design as well as test set changes. The x-align block 10 hardware can be reconfigured based on any given set of test responses. The x-align block 10 is capable of delaying any scan chain by any number of cycles (less than maximum allowable). The x-align block 10 inserts a proper delay for each scan chain 14 so as to align as many response x's as possible, and to observe a maximum number of scan cells through the response compactor 12. The x-align block 10 can be utilized in conjunction with any response compactor to manipulate x distribution in favor of the compactor.

Every response compactor, such as compactor 12, has a particular x-resistance characteristic that is defined by the particular x distribution in which it can still deliver error observability. During a synthesis of the compactor block 12 and its insertion into the netlist, however, the particular x distribution induced by the final production test patterns is typically not known. The x-align block 10 provides this late capability of x distribution manipulation. The insertion of the x-align block 10 can be seamlessly integrated into the design flow. The x-align block 10 area cost is determined by the required scan cell observability enhancement. Even the basic area-efficient versions of the x-align block 10 can deliver significant enhancements in test quality. Therefore, the x-align block 10 and method can be utilized for increasing the scan cell observability, and thus modeled and unmodeled fault coverage delivered by the response compactor 12.

With the x-align block 10, there can be more aggressive compaction of responses. This will reduce number of scan channels needed, and thus enable the utilization of cost-effective low-pin-count testers, while enhancing the reductions in test time and data volume. Additionally, the x-align block 10 will enhance fault detection per test pattern, and thus enable more efficient compaction of test sets, reducing further test time and data volume. By making room for more test patterns in the tester memory, and thus enhancing the test quality further, utilizing the x-align block 10 will improve the diagnostic capabilities of the response compactor 12.

Figure 2:
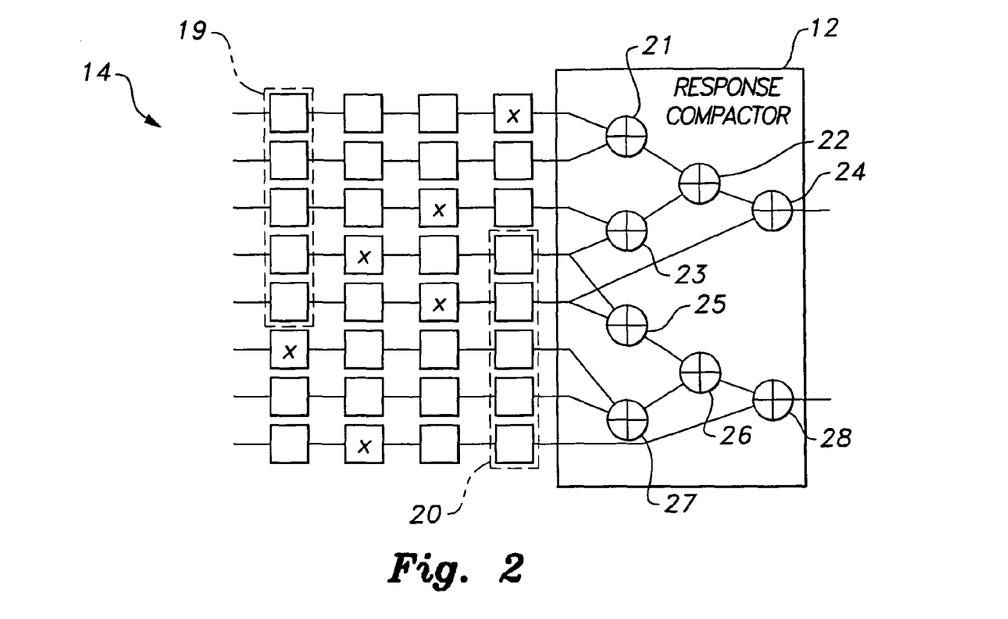
FIG. 2 is a schematic diagram of a scan test pattern that includes an XOR-based response compactor with two parity trees.

With reference to FIG. 2, response compaction in the form of XOR (parity) trees is quite common. In such a scheme, scan chains 14 are grouped in an overlapping or non-overlapping manner, wherein each group drives a distinct XOR tree 24, 28. The response compactor 12 with two overlapping parity trees is provided. In this example, five out of eight internal scan chains 14 drive each one of the two parity trees, where two of the chains drive both XOR trees. The particular grouping of the scan chains 14 determines the aliasing and x-resistance properties of the compactor.

In every shift cycle, the response fragment that corresponds to a scan slice is taken through the response compactor 14. In the case of a single parity tree, all the response bits in a scan slice are XORed into a single bit to be observed within each shift cycle. In FIG. 2, two overlapping fragments of a scan slice are taken through parity trees, resulting in two bits to be-observed in each shift cycle. The fragment driving the upper XOR tree 24 consists of the top 5 scan cells of the scan slice, while the other fragment consists of the bottom 5 scan cells of the scan slice. In total, the number of scan slice fragments that are compacted per test pattern equals the product of the scan depth and the number of XOR trees; in this example, eight scan slice fragments are compacted into eight bits to be observed throughout 4 shift cycles. The scan depth denotes the number of scan cells in the longest scan chain.

Manifestation of the same fault/defect in multiple scan cells within the same slice may result in the cancellation of errors associated with this fault/defect. Specifically, an even number of errors in a scan slice fragment that feeds an XOR tree produces the expected value at the XOR tree output. If a fault/defect consistently manifests in an even number of scan cells for every scan slice fragment, and for every test pattern, the fault/default remains undetected, or in other words, aliased.

All the captured errors in a scan slice fragment become unobserved if also x's are captured in some of the scan cells of the same fragment. A single x suffices to render the complete scan slice fragment unobserved. In the example response x distribution in FIG. 2, only the top leftmost scan slice fragment 19 and bottom rightmost scan slice fragment 20 are observable through the compactor, resulting in ten observable scan cells out of twenty-six scan cells with captured known bits. It is the distribution of the x's that determines which scan cells are observable.

A scan cell is observable when no other scan cell within the same slice fragment has captured an x, and unobservable, otherwise. It should be noted that an error in a scan cell that is deemed as "observable" may be aliased by the response compactor 12 due to errors in other cells of the same fragment. The aim of the x-align block 10 is to maximize the number of observable scan cells. However, this assumes that increased scan cell observability will generally reflect into higher coverage levels. A more representative definition that also accounts for the aliasing properties of the particular response compactor 12 would lead to direct deductions regarding coverage levels.

The distribution of x's can be judiciously manipulated in order to improve scan cell observability. The manipulation of the x distribution can be effected through delaying the shift-out operation of scan chains, wherein the magnitude of delays can be adjusted for the alignment of x's. This alignment reduces the number of unobservable scan cells.

Figure 3:
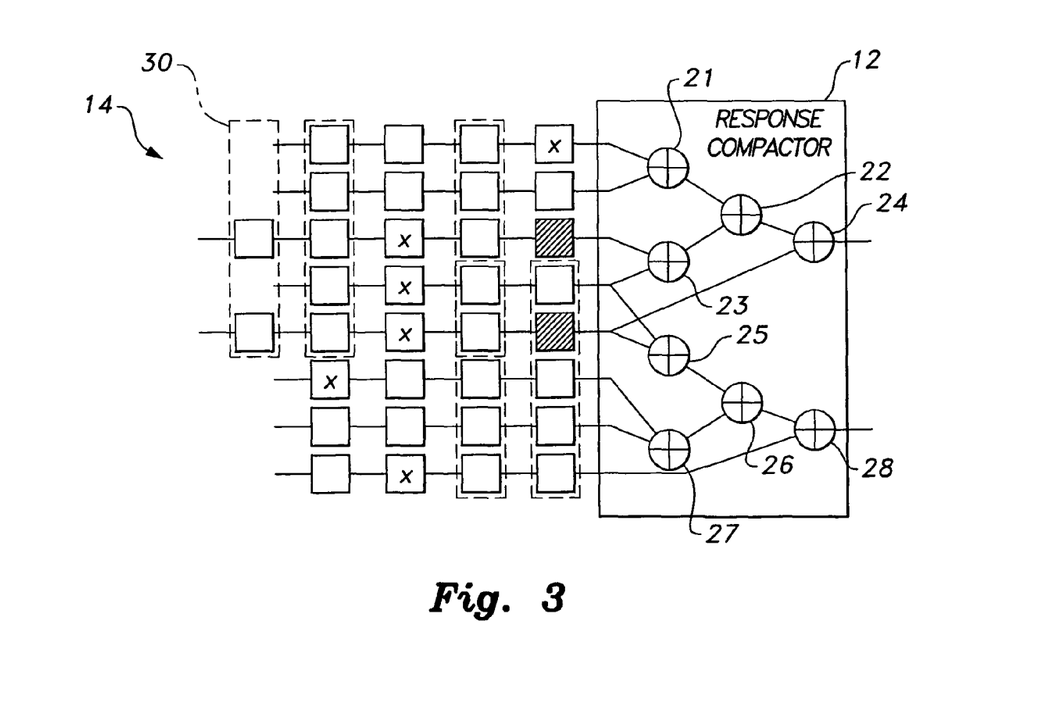
FIG. 3 is a schematic diagram showing delaying shift-out operations in two scan chains for aligning x's in the scan architecture and method for increasing scan cell observability of response compactors according to the present invention.

In FIG. 3, the same example in FIG. 2 is used to demonstrate the beneficial impact of shift-out delay operations. In this case, the shift-out of two of the scan chains 14 is delayed by a single cycle each. Such an alignment of response x's increases the number of observable scan cells from ten to nineteen.

Referring to FIGS. 1, 2, and 3, the x-align block 10 is inserted in between the scan chains 14 and the response compactor block 12, as shown in FIG. 1. A maximum allowable delay of scan chains 14 determines the number of delay elements to be utilized within the x-align block 10 for each chain. Thus, the two parameters required to design the x-align block 10 are the number of scan chains and the maximum allowable delay ($\Delta_{max}$).

As every test pattern may potentially result in a distinct distribution of captured response x's, the alignment operation should be effected on a per test pattern basis. Also, depending on a particular distribution of x's, any chain may have to be delayed by any number of cycles within an allowable range in order to achieve the best alignment of x's. Thus, the x-align block 10 is re-configurable on a per test vector per scan chain basis.

Figure 4:
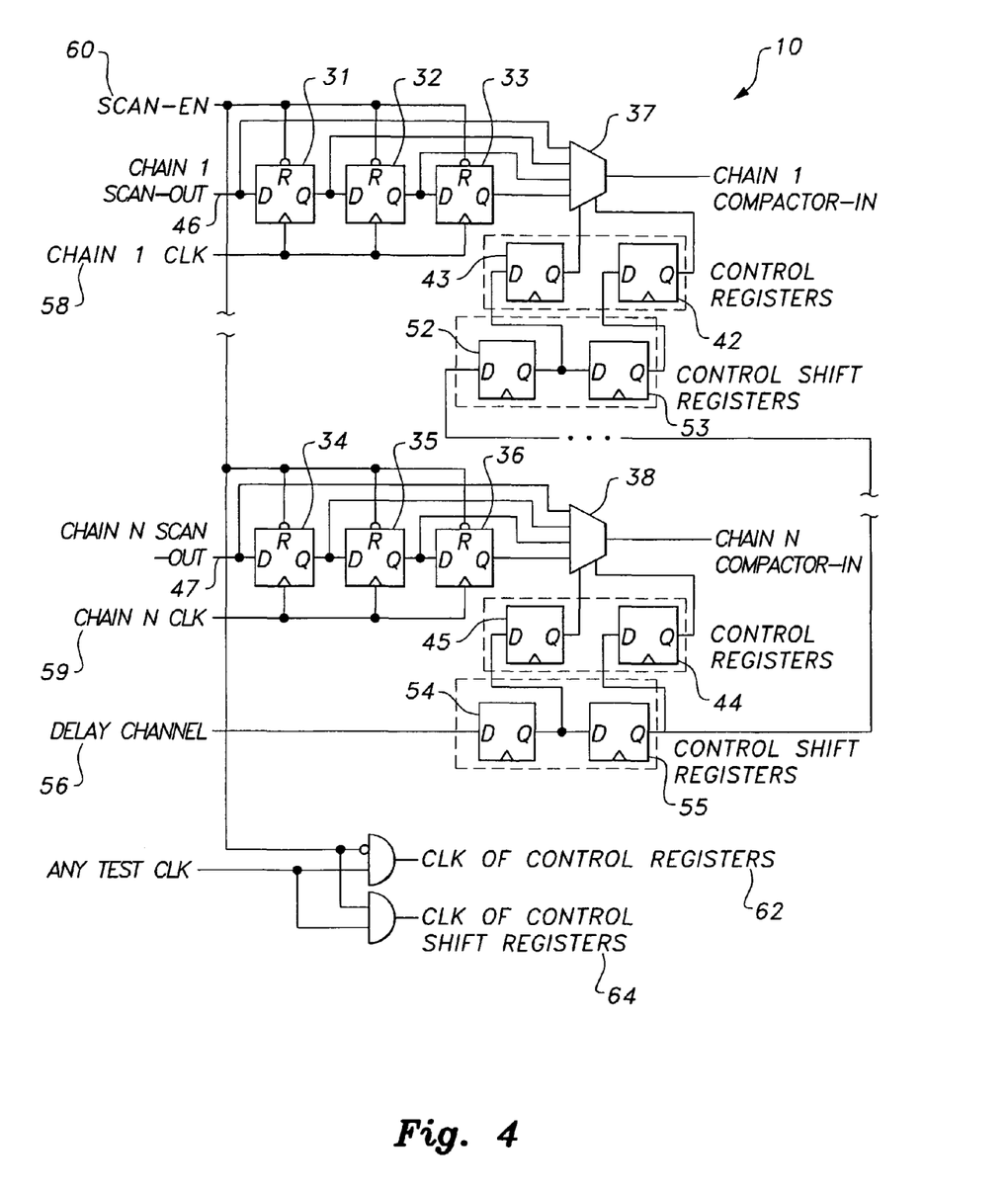
FIG. 4 is a schematic diagram showing an exemplary implementation of an x-align block circuit for increasing scan cell observability of response compactors according to the present invention, with $\Delta_{max}=3$.

An implementation design of the x-align block 10 for $\Delta_{max}=3$ is provided in FIG. 4. In this implementation, $\Delta_{max}$ resettable flip-flops 31, 32, 33, 34, 35, 36, denoted as delay registers, are utilized for every scan chain, generally indicated by the nomenclature 1, N, in order to be able to delay the chain up to $\Delta_{max}$ cycles. The delay registers 31, 32, 33, 34, 35, 36 associated with each chain 1, N are connected serially, extending the tail of the corresponding scan chain 1, N. A multiplexer 37, 38 driven by the delay registers 31, 32, 33, 34, 35, 36 for a chain helps adjust the magnitude of this extension. The select inputs of the multiplexer 37, 38 are driven by $\lceil \log_2(\Delta_{max}+1) \rceil$ flip-flops 42, 43, 44, 45, denoted as control registers, whose values determine how many, if any, delay registers 31, 32, 33, 34, 35, 36 are inserted on the scan-out path 46, 47 of the scan chain 1, N. Any chain 1, N can be delayed by any number of cycles that is not greater than $\Delta_{max}$, as every scan chain 1, N has a dedicated set of control registers 42, 43, 44, 45. The control registers 42, 43, 44, 45 are updated only during the capture cycle with new values that have been shifted into another set of registers, denoted as control shift registers 52, 53, 54, 55.

The reason for utilizing a distinct set of control shift registers 52, 53, 54, 55 is to preserve the content of the control registers 42, 43, 44, 45 throughout the scan operations for a test pattern. All the control shift registers 52, 53, 54, 55 within the x-align block 10 are connected into a single chain that is serially controllable via the delay channel input 56. This input 56 is directly controlled by a tester, enabling on a per test pattern basis the adjustment of the delay of individual scan chains 1, N. The associated control data is serially shifted into the control shift registers 52, 53, 54, 55 during shift cycles concurrently with the shifting-in of the scan stimuli into scan chains 1, N, and is subsequently loaded into the control registers 42, 43, 44, 45 during the capture cycle.

It is typically the case that the length of the control shift register chain is less than the scan depth, having no impact on the number of shift cycles per pattern. For instance, for a scan architecture of 100 scan chains, each with a depth of 1000, the number of control shift registers equals 400 when $\Delta_{max}=15$. In the rare event in which the control shift register chain is longer than the scan depth, various techniques discussed hereinafter can be utilized to mitigate the depth increase problem.

A clock signal 58, 59 provided to the delay registers 31, 32, 33, 34, 35, 36 associated with a scan chain 1, N is the same test clock that drives the scan cells of this chain, as these delay registers 31, 32, 33, 34, 35, 36 constitute an extension of the chain 1, N.

A global scan-enable signal 60 drives an active-low asynchronous reset input of the delay registers 31, 32, 33, 34, 35, 36. During the capture cycle, as this signal is de-asserted, all the delay registers 31, 32, 33, 34, 35, 36 are reset (initialized to known values). This initialization allows for the observation of the first few scan cells in the other chains that are delayed for a fewer number of cycles, as they are XORed with the content of delay registers 31, 32, 33, 34, 35, 36 during the very first scan-out cycles. The scan-enable signal 60 is also used to gate-off clock inputs 62, 64 of the control registers 42, 43, 44, 45 and control shift registers 52, 53, 54, 55. The control shift registers 52, 53, 54, 55 preserve their content during the capture cycle and the control registers 42, 43, 44, 45 preserve their content during the shift cycles.

The x-align block 10 does not necessarily have to be implemented as a hard block. The x-align netlist may be merged into the design netlist at the RT or gate level, enabling the proper physical placement of x-align logic, and thus preventing any potential placement and routing issues.

The delay information to be loaded into the control registers 42, 43, 44, 45 of the x-align block 10 are computed based on a response x distribution analysis. Thus, the input to the analysis is a captured scan response pattern. The target of this analysis is the computation of the proper delay magnitude for each scan chain so as to maximize the number of observable scan cells. The analysis is repeated for each response of a pattern in order to compute the proper delay data for the entire test set.

The delay computation problem can be modeled via Integer Linear Programming formulation, or alternatively solved by a computationally efficient greedy heuristic.

First, the Integer Linear Programming (ILP) formulation is described. In the delay computation process, known and unknown bits in a response should be differentiated. The first step in the formulation is the transformation of the input (scan response pattern) into a map of known and unknown bits, and is defined as:

$$T(c, \delta) := \begin{cases} 1 & \text{if } (\delta - \Delta_{max})^{th} \text{ cell of } c^{th} \text{ chain} = x \\ 0 & \text{otherwise} \end{cases}$$

where $0 \leq c < \text{num\_chains}$, $0 \leq \delta < \text{depth} + 2\Delta_{max}$, num_chains denotes the number of scan chains, and depth denotes the scan depth. The constant binary matrix T captures the position of the response x's; 1-entries in this matrix denotes response x's, and 0-entries, known bits. To also account for any possible delay of scan chains, the matrix T is defined in such a way that additional $\Delta_{max}$ leftmost and $\Delta_{max}$ rightmost columns of all 0's pad the actual transformed scan response bits.

A scan slice fragment consists of cells of the same slice such that these cells drive the same XOR tree. The structure of the particular response compactor 12 utilized along with the x-align block 10 should thus be accounted for in the formulations, as it determines the grouping of cells into scan slice fragments. Thus, the following Boolean function is defined in order to model the structure of any XOR-based compactor, such as compactor 12:

$$\text{Drives}(c, t) := \begin{cases} 1 & \text{if } c^{th} \text{ chain drives } t^{th} \text{ XOR tree,} \\ 0 & \text{otherwise} \end{cases}$$

where $0 \leq c < \text{num\_chains}$, $0 \leq t < \text{num\_trees}$, and num_trees denotes the number of XOR trees in the response compactor 12.

The next step is the definition of the solution variables. The ultimate goal is to compute a delay value for each scan chain, where the delay can be assigned any value between 0 and $\Delta_{max}$, both inclusive. For the constraints to be linearly defined, however, the solution variables are defined as a two dimensional binary matrix:

$$d_{c\delta} := \begin{cases} 1 & \text{if } c^{th} \text{ chain is delayed by } \delta \text{ cycles,} \\ 0 & \text{otherwise} \end{cases}$$

where $0 \leq c < \text{num\_chains}$, $0 \leq \delta \leq \Delta_{max}$.

The first set of constraints ensures that a single delay value is assigned for each scan chain:

$$\sum_{\delta=0}^{\Delta_{max}} d_{c\delta} = 1, \forall_{0 \leq c < \text{num\_chains}}$$

Next, intermediate binary variables $s_{kt}$ are defined that denote whether a scan slice fragment is unobservable:

$$s_{kt} = \bigvee_{0 \leq c < \text{num\_chains} \wedge \text{Drives}(c,t)} \sum_{\delta=0}^{\Delta_{max}} d_{c\delta} \cdot T(c, k+\delta),$$

$$\forall_{0 \leq k < \Delta_{max} + \text{depth}} \forall_{0 \leq t < \text{num\_trees}}$$

where $s_{kt}$ denotes the fragment of scan cells in the $k^{th}$ scan slice driving the $t^{th}$ XOR tree. This fragment is unobservable if any one of the cells in this fragment has an x in the scan response. In this case, the variable is set to 1. The OR clause is used test the unobservability condition for every scan cell that belongs to this fragment. For a scan cell on chain c, the condition is computed by a summation over all possible delay values for this chain. As the delay of a chain determines which scan cell on this chain belongs to the $k^{th}$ slice, the binary variable $d_{c\delta}$ is multiplied with the T entry inside the summation. As only one of $d_{c\delta}$'s can be 1 for chain c, only the scan cell that would shift into slice k due to a delay of $\delta$ cycles is checked for an x.

It should be noted though that modeling of constraints by using an OR operation is not allowed in ILP. Thus, the constraint is converted into a set of linear constraints by utilizing the following transformation rule:

$$y = \bigvee_{i=0}^{n-1} a_i \Rightarrow y \leq 1 \text{ and } y \leq \sum_{i=0}^{n-1} a_i \leq n \cdot y$$

which yields:

$$s_{kt} \leq 1 \text{ and}$$

$$s_{kt} \leq \sum_{0 \leq c < num\_chains \wedge Drives(c,t)} \sum_{\delta=0}^{\Delta_{max}} d_{c\delta} \cdot T(c, k+\delta) \leq num\_chains \cdot s_{kt}$$

Finally, an optimization criterion is defined, such as:

$$\text{minimize} \sum_{t=0}^{num\_trees-1} \cdot \sum_{k=0}^{\Delta_{max}+depth-1} s_{kt}$$

wherein the minimization of the number of unobservable scan slice fragments is targeted.

Figure 5:
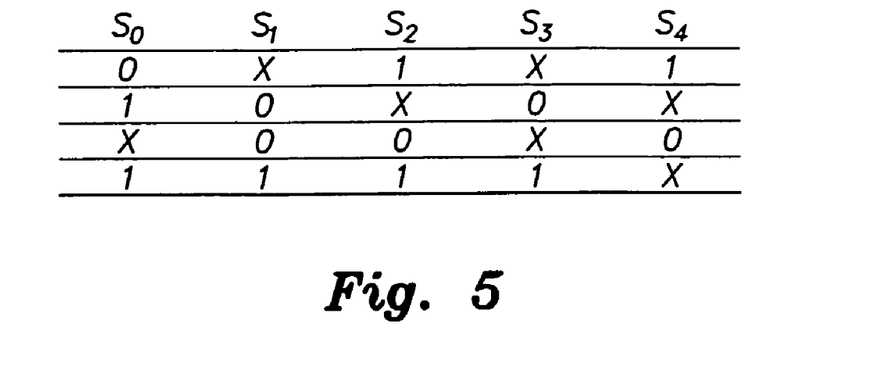
FIG. 5 is an exemplary captured scan response pattern in four scan chains, each with five scan cells.

The generation of the ILP constraints and objective on a scan response that has been captured in a scan architecture of four scan chains, each with five scan cells, is provided in a table illustrated in FIG. 5. Thus, num_chains=4 and depth=5. Suppose that the response compactor in this case consists of a single XOR tree. Thus, num_trees=1. Originally, no slices, and thus no scan cells are observable, as every slice contains at least one x.

Figure 6:
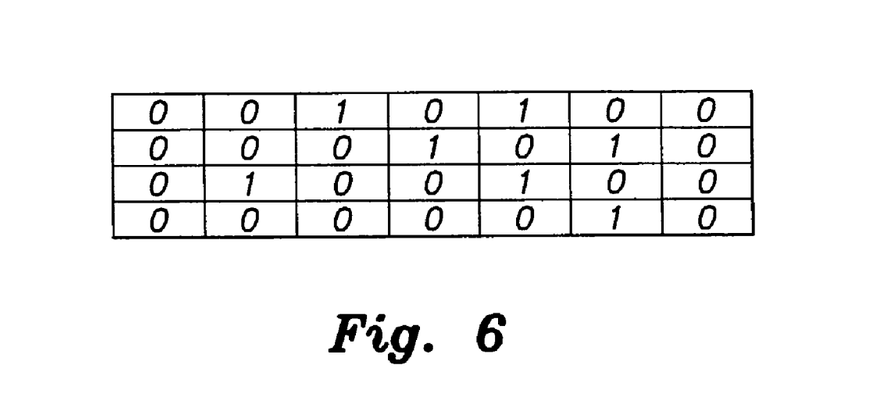
FIG. 6 illustrates a constant binary matrix T which represents the captured response pattern of FIG. 5.

Suppose also that the maximum allowable delay in any chain is a single cycle: $\Delta_{max}=1$. First, the constant binary matrix T is generated. As $\Delta_{max}=1$, one leftmost column and one rightmost column with all 0's are added to the transformed response bits. The resulting matrix is provided in a table shown in FIG. 6, where each 1-entry denotes a response x.

The constraints that ensure that every scan chain can be assigned exactly one delay value are computed, next. Since $\Delta_{max}=1$, two binary $d_{c\delta}$ variables are defined for each chain. The first set of constraints is:

$d_{00}+d_{01}=1$ $d_{10}+d_{11}=1$ $d_{20}+d_{21}=1$ $d_{30}+d_{31}=1$

One binary $s_{kt}$ variable is defined for each scan slice fragment. In this particular case, the compactor 12 will consist of a single XOR tree, and thus each slice is a fragment. To improve the readability of the formulations, the second index of the $s_{kt}$ variables is dropped, leading to variables denoted as $s_k$ with no loss of representational power. The second set of constraints can thus be computed as:

$s_0 \leq 1, s_1 \leq 1, s_2 \leq 1, s_3 \leq 1, s_4 \leq 1, s_5 \leq 1$ $s_0 \leq d_{21} \leq 4s_0$ $s_1 \leq d_{01}+d_{20} \leq 4s_1$ $s_2 \leq d_{00}+d_{11} \leq 4s_2$ $s_3 \leq d_{01}+d_{10}+d_{21} \leq 4s_3$ $s_4 \leq d_{00}+d_{11}+d_{20}+d_{31} \leq 4s_4$ $s_5 \leq d_{10}+d_{30} \leq 4s_5$ For instance, the constraints computed for $s_1$ represents the condition when the second leftmost slice becomes unobservable. The original constraint is an OR formulation, which states that $s_1=d_{01} \vee d_{20}$. In other words, the formulation states that if chain 0 is delayed by one cycle or chain 2 is not delayed, the second leftmost slice would be containing at least one x, and thus become unobservable.

The optimization criterion can be defined as the minimization of unobservable scan slices as follows:

minimize $s_0+s_1+s_2+s_3+s_4+s_5$

Figure 7:
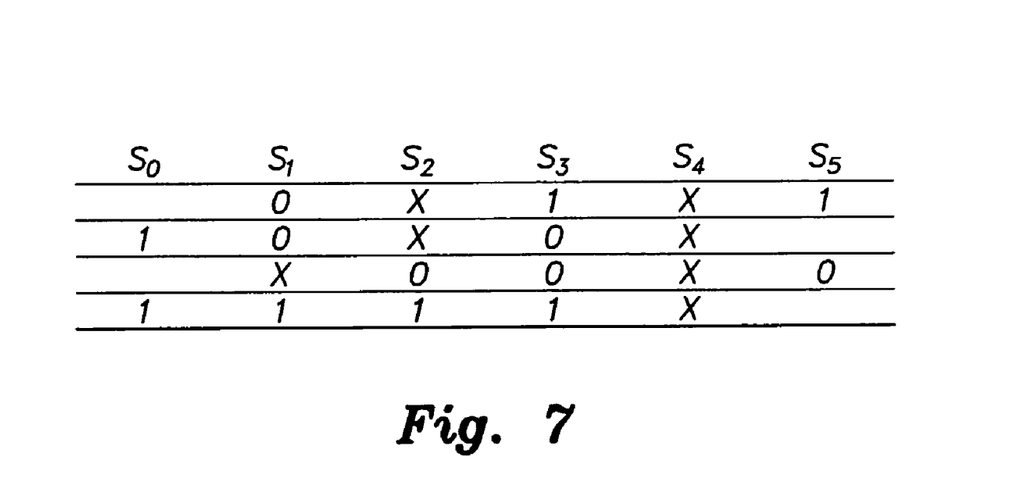
FIG. 7 illustrates a table with an exemplary optimal slice configuration for the captured response pattern of FIG. 5.
Figure 8:
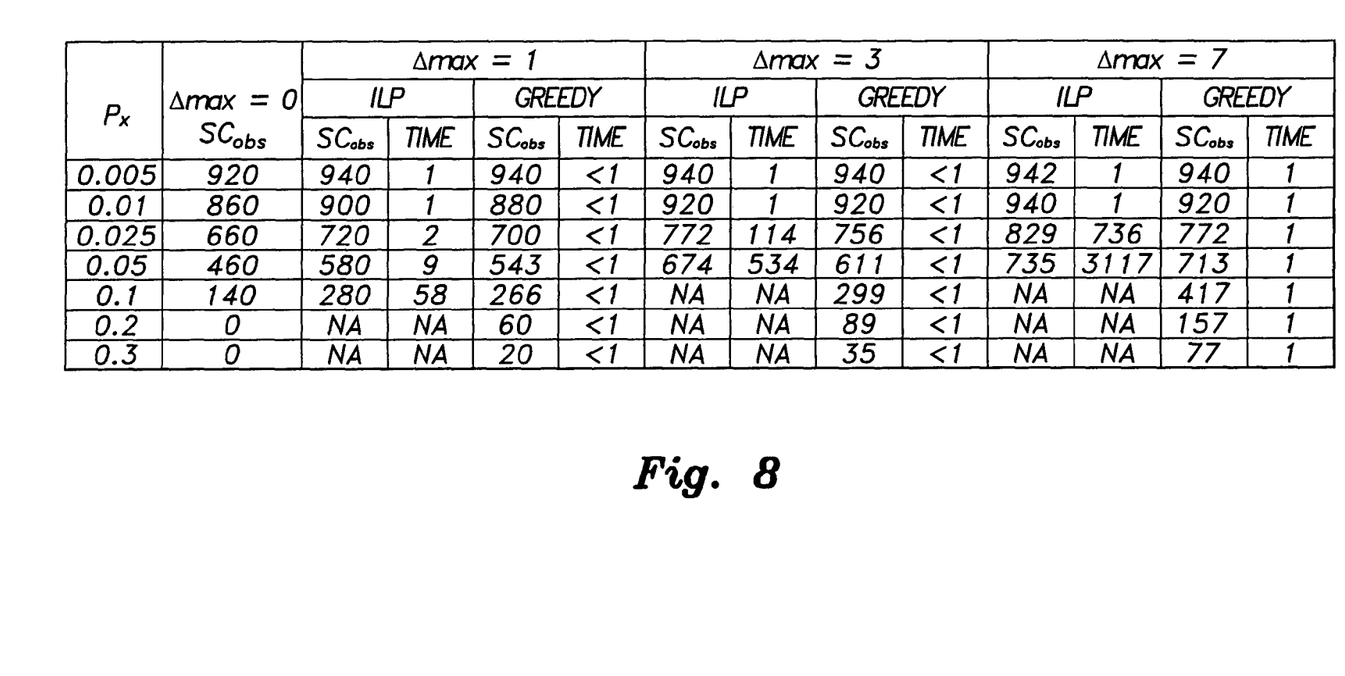
FIG. 8 illustrates a table for a comparison of an ILP solver and a greedy heuristic utilized with the x-align block circuit in a method for increasing scan cell observability of response compactors according to the present invention for a scan architecture of twenty scan chains with a depth of fifty.

With respect to the table shown in FIG. 5, one optimal solution for this instance, wherein the sum of $s_k$ variables is minimized to 3, is the following assignment:

$d_{01}=d_{10}=d_{21}=d_{30}=0$ $d_{00}=d_{11}=d_{20}=d_{31}=1$ $s_0=s_3=s_5=0, s_1=s_2=s_4=1$ which suggests that the delay of chains 1 and 3 by one cycle enables the observation of the slices 0, 3, and 5, while the slices 1, 2, and 4 are unobservable. The resulting chain delay configuration is provided in a table illustrated in FIG. 7. It can be seen that eight scan cells become observable due to the ILP-driven alignment of x's.

The minimization of unobservable scan slices may not always yield the solution wherein the number of unobservable scan cells is minimized however, as the scan slice fragments may be of different sizes. Due to the possibly different delay values of scan chains, the leftmost and the rightmost slices may consist of fewer scan cells than the slices in the middle. Going back to the example described with reference to FIG. 3, the scan slice fragments that are on either side of the scan chains may contain fewer scan cells due to the delaying of the scan chains, as can be observed from where the rightmost and the leftmost scan slice fragments have fewer scan cells compared to the other fragments. The fact that the majority of the slice fragments are of identical sizes, however, results in a very high correlation between the number of unobservable scan slice fragments and the number of unobservable scan cells. Nevertheless, the formulation is provided for minimizing the number of unobservable scan cells.

In order to derive an exact optimization criterion, new variables $w_{cjt}$, which denote whether a cell of chain c is included in the slice fragment $s_{kt}$, are introduced as follows:

$w_{ckt}^L = s_{kt} \wedge d_{c(\Delta_{max}-k)},$ $\forall_{0 \leq k < \Delta_{max}} \forall_{0 \leq c < num\_chains} \forall_{0 \leq t < num\_trees},$ $w_{ckt}^R = s_{kt} \wedge d_{c(k-\Delta_{max}-depth+1)},$ $\forall_{depth \leq k < \Delta_{max}+depth} \forall_{0 \leq c < num\_chains} \forall_{0 \leq t < \Delta num\_trees}$ where $w_{ckt}^L$ enables the computation of the scan slice fragment sizes for the left-end of the chains, and $w_{ckt}^R$, for the right-end of the chains. These constraints must be converted to linear ones, however, as follows:

$$w_{ckt}^L \geq s_{kt} + d_{c(\Delta_{max}-k)} - 1$$

$$2w_{ckt}^L \leq s_{kt} + d_{c(\Delta_{max}-k)}$$

$$w_{ckt}^R \geq s_{kt} + d_{c(k-\Delta_{max}-depth+1)} - 1$$

$$2w_{ckt}^R \leq s_{kt} + d_{c(k-\Delta_{max}-depth+1)}$$

by using the following transformation rule for AND operation:

$$a = b \wedge c \Rightarrow a \geq b+c-1 \text{ and } 2a \leq b+c$$

The optimization criterion can thus be defined as:

$$\text{minimize} \left\{ \begin{array}{l} \sum_{t=0}^{num\_trees-1} \sum_{j=0}^{\Delta_{max}-1} \sum_{c=0}^{num\_chains-1} \sum_{k=0}^{j} w_{ckt}^L + \\ \sum_{t=0}^{num\_trees-1} \sum_{j=depth}^{\Delta_{max}+depth-1} \sum_{c=0}^{num\_chains-1} \sum_{k=j}^{\Delta_{max}+depth-1} w_{ckt}^R + \\ num\_chains \cdot \sum_{t=0}^{num\_trees-1} \sum_{k=\Delta_{max}}^{depth-1} s_{kt} \end{array} \right\}$$

where the objective is fine-tuned to minimize the number of unobservable scan cells.

While the ILP formulation enables the utilization of efficient ILP-solvers to obtain a near-optimal solution, the computational run-time may be prohibitive for large-size instances. For industrial-size designs, a computationally efficient greedy heuristic can be implemented in order to align x's in a scan response. For more aggressive scan cell observability results, ILP techniques, along with well-known approximation methods, can be utilized in conjunction to deliver results in reasonable run-times.

A greedy heuristic can be implemented as follows. The heuristic initially computes the number of aligned x's between two chains delayed relatively by a certain number of cycles. Since the delay can be as large as $\Delta_{max}$, the relative delay of the two chains may take any value between $-\Delta_{max}$ and $\Delta_{max}$. The evaluations are repeated for every pair of chains that drive the same XOR tree, and for every possible relative delay value. From all these trials, the chain pair and relative delay combination that leads to the maximum number of aligned x's is selected. The chain within the selected pair that is delayed more compared to the other chain in the pair is assigned the absolute value of the selected relative delay, while the other chain is assigned a delay value of 0. The computational complexity of this part of the heuristic is $O(\Delta_{max} \cdot num\_chain^2 \cdot depth)$.

The second part of the heuristic assigns delay values to chains by handling one scan chain at a time. One unhandled chain and one relative delay value are evaluated in terms of the number of unobservable scan cells that results from the delay of this chain by this delay value with respect to the already handled chains. The evaluation is repeated for every unhandled chain and for every possible relative delay value until all chains are assigned a delay value; the relative delay values being evaluated comply with the constraint that the difference between the minimal and maximal delays is always less than or equal to $\Delta_{max}$. The selected chain is assigned the relative delay. The computational complexity of this step is also $O(\Delta_{max} \cdot num\_chain^2 \cdot depth)$.

As a final step, the heuristic normalizes the delays. In other words, the minimally delayed chain is assigned 0 as the absolute delay, and the delay value of all the other chains are adjusted accordingly. The computational complexity of this step is $O(num\_chain)$.

Thus, the complexity of the greedy heuristic, which is provided, as follows, in Table 1, is $O(\Delta_{max} \cdot num\_chain^2 \cdot depth)$.

TABLE I

| Compute__X__Align__Data (Scan Response) |
|---|
| For every pair of scan chains, if they drive the same XOR tree |
|     For every possible relative delay ($-\Delta_{max}$ to $\Delta_{max}$) |
|         Compare number of aligned x's; |
| Select the (chain pair, relative delay) with max aligned x's: |
| Assign the selected chains selected delays; |
| Repeat until all chains are assigned delays |
| For every scan chain that has not been assigned a delay |
|     For every allowable delay relative to other chains |
|         Compute the number of unobservable cells |
|         when this chain is delayed by this amount; |
|     Select the (chain, relative delay) with min number of unobservable cells; |
|     Assign the selected chain selected delay; |
| Normalize delays and exit; |

The impact of the x-align block 10 on the design flow is now discussed. Specifically, the insertion and the stitching of the x-align block hardware 10, and the test development in the presence of the x-align block 10 are described.

Typically, stimulus decompression and response compaction blocks are inserted and stitched into the scan architecture during the physical scan stitching phase, subsequent to the physical placement of the logic cells in the design. Alternative flows do exist, wherein these blocks are inserted earlier at RT-level or during gate-level synthesis. Whichever flow is being utilized, a good strategy is to insert the x-align block 10 during the same design stage wherein the decompressor and the compactor blocks are being inserted.

Similarly, the stitching of the x-align block 10 in between the scan chain outputs and the response compactor inputs can be effected during the same stage wherein the decompressor and the compactor 12 are stitched to the scan chains 14, which is typically the physical scan stitching phase. The connections to the clock and the scan-enable inputs of the x-align block 10 can be made right after the block is instantiated in the design, or can be deferred until the scan stitching step. During the clock tree balancing phase, which follows up the physical scan stitching phase, timing closure can be properly effected for the registers in the x-align block 10 along with the functional registers in the design. The insertion and the stitching of the x-align block 10 can thus be effected seamlessly.

The x-align block 10 has no impact on the ATPG process. ATPG tool can be forced to bypass the x-align block 10 by providing the tool with the proper constraints on the select lines of the multiplexers 37, 38 within the x-align block 10. Once the test patterns are generated with the x-align block 10 bypassed, the delay information to be shifted into the x-align block 10 can be computed by executing either an ILP solver or the greedy heuristic on the scan responses. The data to be shifted in from the delay channel 56 is then appended to the ATPG generated stimuli. A subsequent logic and/or fault simulation with the extended stimuli helps compute the expected compacted responses wherein the scan chain delays are also accounted for.

Design changes late in the design flow are quite common, and are implemented in the form of ECOs. The ECOs that do not require the re-stitching of the scan chains 14 have no impact on the x-align block hardware 10, which remains intact; as ATPG has to be executed on the design modified by the ECO, however, the x-align delay data should be recomputed by either the ILP solver or the greedy heuristic, and the logic/fault simulation steps thereafter should be repeated.

The insertion of the x-align block 10 has various implications, including both positive and negative ones. Now, these implications are outlined and presented with simple strategies for reducing costs while maximizing benefits of the x-align block 10.

The cost implications of the utilization of the x-align block 10 are based on area overhead. The x-align block 10 consists of flip-flops 31, 32, 33, 34, 35, 36, 42, 43, 44, 45, 52, 53, 54, 55 and multiplexers 37, 38 for the most part. The number of flip-flops equals num_chains·$(\Delta_{max}+2\ \log_2(\Delta_{max}+1))$. The number of $\Delta_{max}+1$ by 1 multiplexers equals num_chains. The area overhead of the x-align block 10 can be directly controlled by adjusting $\Delta_{max}$. Design constraints and area budget directly determine the proper value for $\Delta_{max}$.

The test data volume penalty imposed due to the x-align block 10 is twofold. First, the delay of the scan chains 14 may potentially incur additional shift cycles for the complete scan-out of responses. In the worst case, an additional $\Delta_{max}$ cycles is expended for each test pattern. This penalty can be alleviated or even eliminated by exploiting the scan chain length differences. By preventing the delay of the longer chains, the delay of the shorter chains can be hidden at the expense of reducing the efficacy of the x-align block 10, as the full potential of the x-align block 10 would not have been explored in that case.

Secondly, test data volume penalty also occurs due to the additional delay information that is shifted in from the delay channel 56. The number of additional bits per test pattern equals the number of control registers 52, 53, 54, 55 within the x-align block 10, which is num_chains·$\log_2(\Delta_{max}+1)$. The consequent stimulus volume expansion per pattern can be computed as:

$$\frac{\text{num\_chains} \cdot \log_2(\Delta_{max}+1)}{\text{num\_chains} \cdot \text{depth}} = \frac{\log_2(\Delta_{max}+1)}{\text{depth}}$$

Typically, scan depth is significantly larger than $\log_2(\Delta_{max}+1)$, whose value would mostly be dictated by the area budget, resulting in insignificant levels of stimulus volume expansion.

In order to account for stimulus compression that is typically employed in a test environment, the test data volume penalty of the x-align block 10 should account for the compression ratio. Specifically, the penalty value computed by the previous formula is magnified, by multiplying it with the compression ratio.

The benefits delivered by the x-align block 10 are in test quality and diagnostic enhancements. As the alignment of x's increases the number of observable scan cells, more errors propagate into the response compactor 12. Consequently, more of these errors can be expected to be detected, enhancing both modeled and unmodeled fault coverage, and thus the test quality.

A diagnosis process aims at identifying the scan cells that captured an erroneous response. In the presence of the response compactor 12, response x's hamper the diagnostic capabilities. The reconfigurability of the x-align block 10 in the form of adjusting the delay of each scan chain can be benefited in order to improve the diagnostic capabilities. The alignment of x's also enhances diagnostic resolution, as the degrading impact of x's is alleviated, allowing for more scan cells to be observed, and thus enabling a better differentiation of scan cells. Alternatively, or in conjunction, the same diagnostic pattern can be applied multiple times with differing chain delay values to gather more diagnostic information. In either case, diagnostic capabilities of the response compactor 12 are enhanced.

As the scan cell observability is improved through the alignment of x's, every test pattern potentially detects more faults. As a result, test set can be further compacted based on a certain fault model. A fault simulation of the test patterns, with the response x's aligned, pinpoints the test patterns that no longer detect any additional faults compared to those detected by all the other test patterns. Dropping these useless test patterns from the test set reduces the test set size, cutting down test time and data volume, offsetting or even exceeding the test time and data volume penalty mentioned earlier.

As the x-align block 10 delivers enhanced resistance to response x's, more aggressive compaction of responses can be pursued. In the presence of the x-align block 10, a compactor that consists of fewer parity trees and thus drives fewer tester channels can be utilized, yet delivering the same test quality level. Thus, a low cost tester that has a lower pin count can be utilized. As fewer scan channels need to be dedicated for compacted response observation, more channels can be utilized for shifting in stimuli. The scan depth can thus be reduced, lowering test time also, offsetting or even exceeding the test time and data volume penalty mentioned earlier.

The area cost of the compactor 12 determines the quality delivered by the associated compaction technique. As the x-align block 10 enhances the quality of the compactor 12, a reduced-area version of the same compactor can be utilized in conjunction with the x-align block 10, in order to deliver the same level of test quality. The area penalty of the x-align block 10 may potentially be offset as a result.

The x-align block 10 and method have been implemented and applied on randomly generated response data, using the test data of ISCAS89 benchmark circuits, and on the test data of two industrial circuits in order to gauge the effectiveness of the x-align block 10. These results are shown in tables format illustrated in FIGS. 8-12, 14A, and 14B.

In the first set of experiments, the two techniques that accompany the x-align block 10, namely, ILP-solver and greedy technique, in terms of scan cell observability and runtime are compared. A response pattern is randomly generated with a certain unknown probability. The underlying scan architecture in this case consists of 20 scan chains, each with 50 scan cells, that drive a single XOR tree. The two techniques are applied on this pattern to align x's. The results are provided in the table illustrated in FIG. 8. The first column provides the probability of x's based on which the scan response is generated. The second column provides the number of observable scan cells when no scan chain is delayed. Every pair of subsequent columns provides the number of observable scan cells that the x-align block 10 delivers, and the associated run-time in seconds, respectively. This data is provided for both the ILP solver and the greedy heuristic for various values of $\Delta_{max}$. It can be seen from the results that the number of observable scan cells that greedy heuristic delivers is always below that of the ILP solver, while the results are typically close if not identical. There is a significant gap between the run-times however; the greedy heuristic is considerably faster compared to the ILP solver. The run-time gap widens up as the probability of response x's or $\Delta_{max}$ is increased, as in either case, the ILP solver has to deal with more variables. Actually, for the largest values of $P_x$ and $\Delta_{max}$, the ILP solver fails to halt within a reasonable amount of time, while the greedy heuristic delivers a solution within one second.

Figure 9:
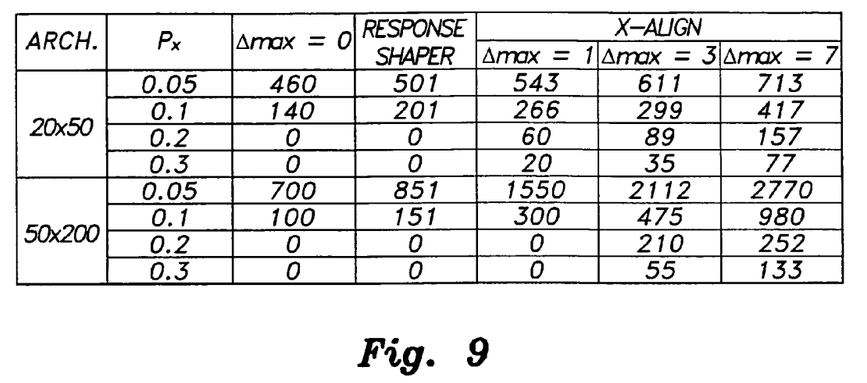
FIG. 9 illustrates a table for scan cell observability results with a single XOR tree as the compactor in a circuit and method for increasing scan cell observability of response compactors according to the present invention.

In the table shown in FIG. 9, the scan cell observability results are presented. A comparison between the scan cell observability results of the x-align block 10 with those of a response shaper is provided. The results are provided for two different scan architectures; in the first one, 20 chains, each with 50 scan cells, drive a single XOR tree, while in the second one, 50 chains with a depth of 200 drive a single XOR tree. Similar to the previous set of experiments, random scan responses are generated with varying values of unknown x probability. The response shaper results are provided under Column 4, while Columns 5-7 provide the results of the x-align block 10 for different values of $\Delta_{max}$.

The results clearly show that the x-align block 10 delivers further significant scan cell observability enhancements compared to the response shaper. Allowing multiple chains to be delayed is the key to attaining scan cell observability boost, which is more apparent for higher values of $P_x$ and larger numbers of longer scan chains. For instance, in the larger scan architecture, an unknown probability of 5% results in only 700 out of 10,000 cells to be observable through the XOR tree. The response shaper increases this number to 851, while the x-align block 10 helps observe more than twice the number of originally observable cells, delivering 1550 observable scan cells even when $\Delta_{max}=1$. Larger values of $\Delta_{max}$ further increase the number of observable scan cells by the x-align block 10. Actually, incremental improvements of the response shaper in the form of delaying a chain by multiple cycles, fail to provide observability levels of even the very basic version of the x-align block 10. Also, implemented is an incremental improvement on the response shaper, and seen in our experiments that scan cell observability of response shaper with a chain delayed by up to even 7 cycles is consistently lower than that of the x-align block 10 with a single cycle delay.

In the next set of experiments, the x-align block 10 is utilized with a response compactor that consists of multiple XOR trees. Specifically, multiple identical-sized (two, four, and eight) parity trees are utilized as the compactor for the 50×200 architecture. The first tree compactors consist of two, four, and eight non-overlapping parity trees, while the last compactor consists of eight overlapping trees, wherein the overlapping of the trees is structured as proposed in the x-compact technique for the particular case of every chain fanning out to exactly three channels.

With heightened levels of x ratios in test responses, compactors such as the widely utilized x-compact, which are based on overlapping parity trees, suffer from reduced scan cell observability levels. The underlying reason is that in such compactors scan chains fan out to multiple tester channels, suffering form the quick spreading of x's and the consequent corruption of compacted response bits. In the presence of highly x-populated response, non-overlapping parity trees, wherein the corruption impact of x's is contained within only a single parity tree, and thus, a single tester channel, become a better choice of compactors. Thus, a compactor with non-overlapping parity trees offers higher levels of scan cell observability.

Figure 10:
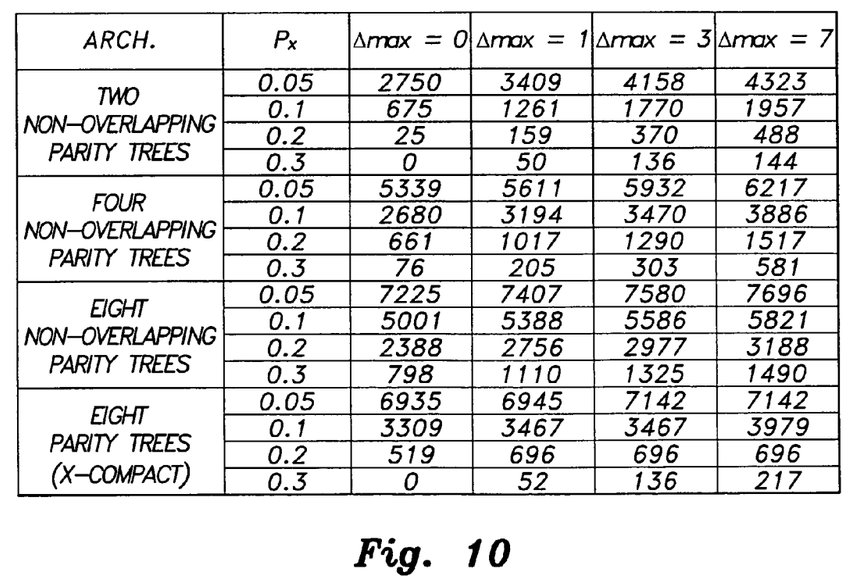
FIG. 10 illustrates a table with scan cell observability results of the x-align block with multiple XOR trees in a circuit and method for increasing scan cell observability of response compactors according to the present invention for a 50×200 scan architecture.

FIG. 10 shows results in table format that also verify that the compactor with eight non-overlapping parity trees consistently provides higher observability levels than x-compact with eight parity trees. The results also show that the x-align block 10 can still be utilized to further improve scan cell observability in all cases. Specifically, the x-align block 10 improves the observability of x-compact by almost 20% ($P_x=0.1$ and $\Delta_{max}=7$), and that of the compactor with non-overlapping eight parity trees by 87% ($P_x=0.3$ and $\Delta_{max}=7$). The combination of simple non-overlapping parity trees along with the x-align block 10 offers the overall best observability levels.

Figure 11:
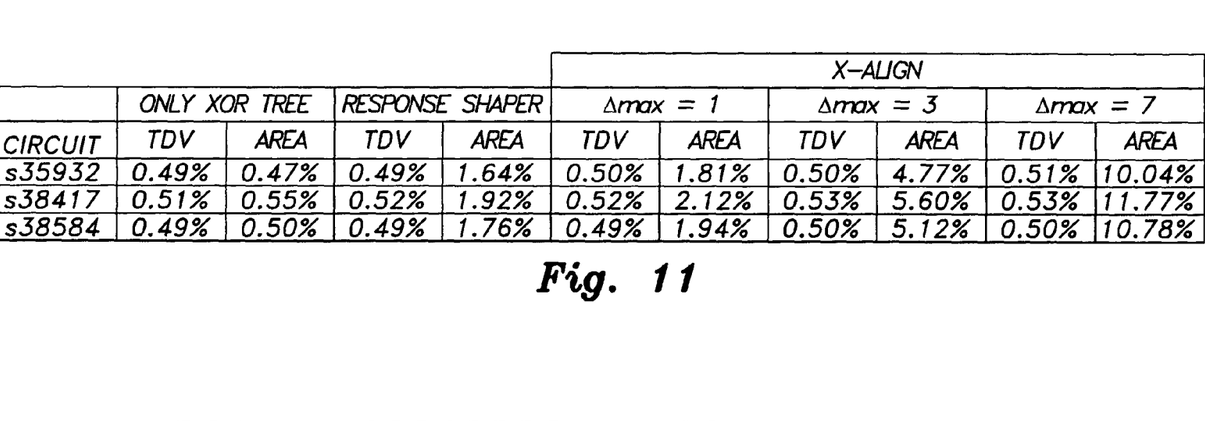
FIG. 11 shows cost comparisons on ISCAS89 benchmark circuits with twenty chains and a single XOR tree as the compactor, without, versus with the x-align block and method for increasing scan cell observability of response compactors according to the present invention.

In order to gauge the test data volume and area impact of the invention, it is applied on the largest ISCAS89 circuits with an underlying scan architecture of 20 scan chains that drive a single XOR tree. FIG. 11 sets forth a table that provides the results wherein the impact of response shaper, and of the x-align block 10 with various $\Delta_{max}$ values are evaluated. Both the test data volume and area cost results are provided in terms of percentages, wherein the base case is the original circuit with twenty scan chains; area cost of the base case includes the scan overhead. The area overhead results, which are measured by the weighted gate count, namely, gate count multiplied by the average fan-in, are computed as a percentage with respect to the base case. The reported area costs for the x-align block 10 and the response shaper does not include the cost of the XOR tree.

Test data volume of the base case includes those of uncompressed stimuli and uncompacted responses. The reported test data volume numbers are percentages with respect to the base case. It can be seen that the increase in test data volume due to both the x-align block 10 and response shaper are negligible compared to the utilization of only a single XOR tree.

The area cost of the x-align block 10 increases with higher values of $\Delta_{max}$, as the number of registers inside the x-align block 10 increases. The response shaper block consists of a decoder, as opposed to the control registers 42, 43, 44, 45 in the x-align block 10. The trade-off between area cost and test quality and/or test cost reduction can be exploited by adjusting the parameters of the x-align block 10. The larger investments in the form of area cost return as increased levels of test quality and/or test cost reductions, as can be observed from the table illustrated in FIG. 12 and FIG. 13.

Figure 12:
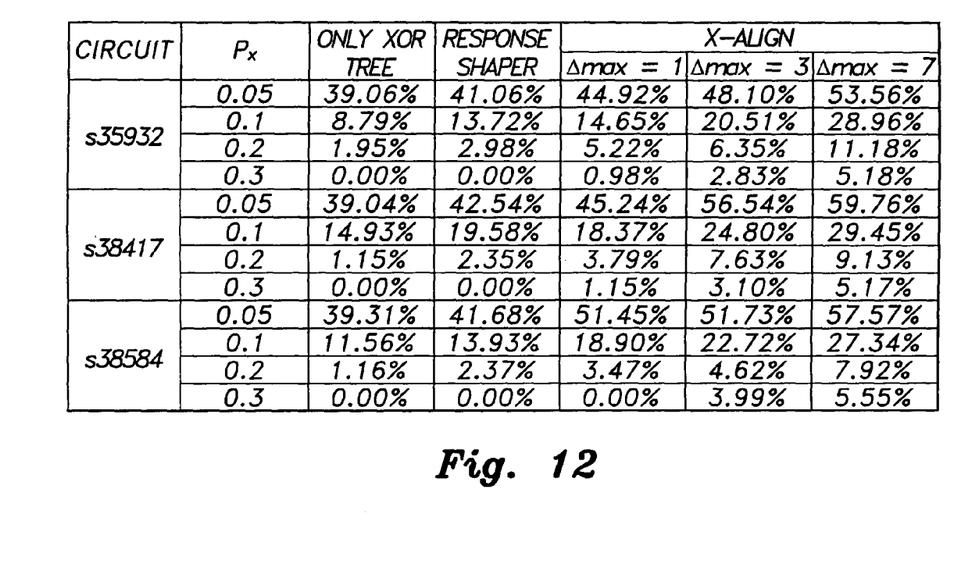
FIG. 12 shows scan cell observability comparisons on ISCAS89 benchmark circuits with twenty chains and a single XOR tree as the compactor, without, versus with the x-align circuit and method for increasing scan cell observability of response compactors according to the present invention.
Figure 13:
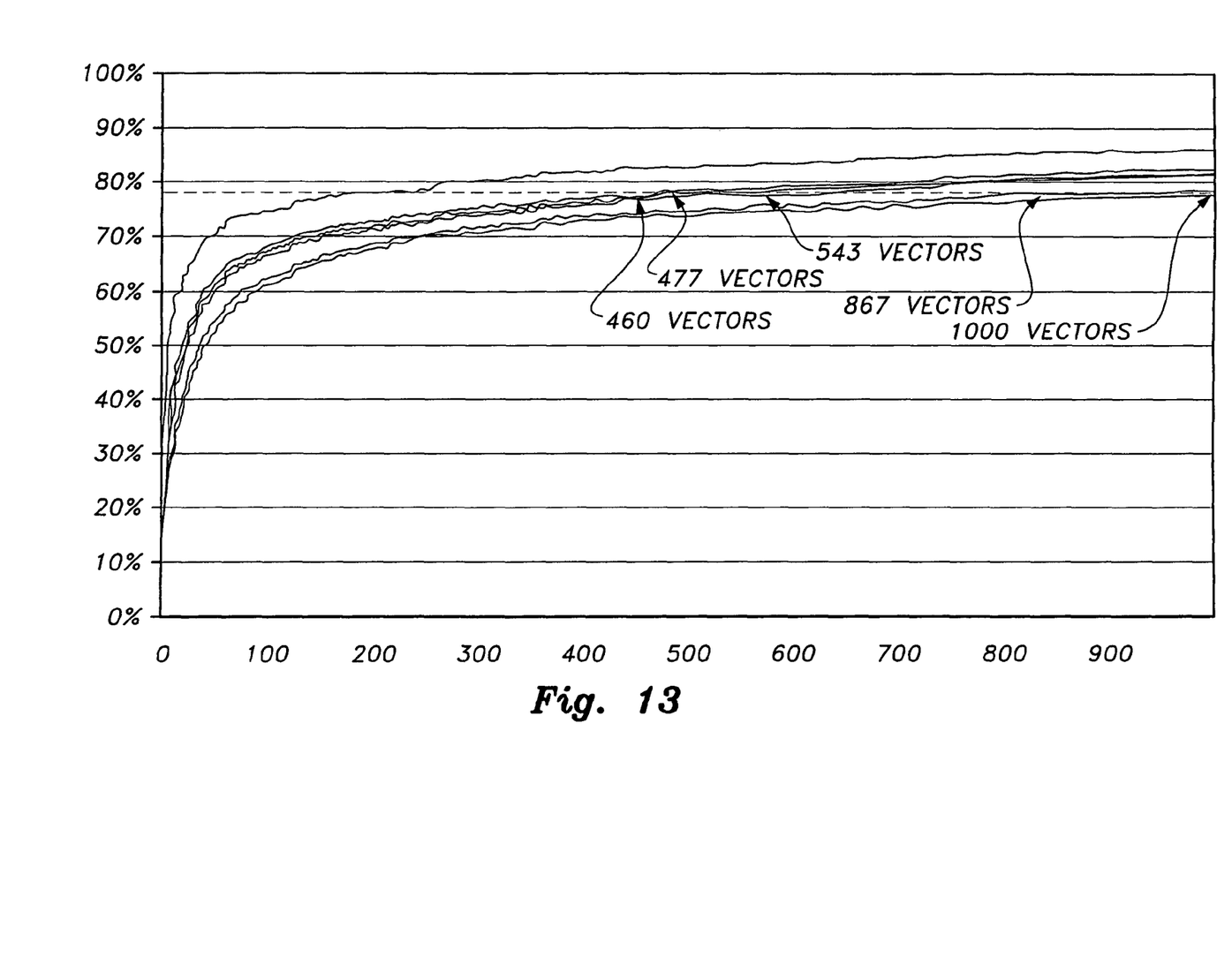
FIG. 13 shows comparisons in terms of fault coverage ramp-up on the s15850 benchmark circuit, without, versus with an x-align circuit and method for increasing scan cell observability of response compactors according to the present invention.

With respect to FIGS. 12 and 13, the benefit comparisons of the invention applied on the same benchmark circuits is presented. For each of the three largest ISCAS89 circuits, both response shaper and the x-align block 10 are applied for various unknown probabilities. The percentage scan cell observability that each technique delivers is reported. For the circuit s35932, for instance, in the presence of 5% response x's, a simple parity observes only 39% of the scan cells, while the utilization of response shaper increases the ratio to 41%. The x-align block 10, utilized with a maximum delay of a single cycle, enables 45% of the scan cells to be observed. By increasing $\Delta_{max}$ to 7, almost 54% of the scan cells become observable, delivering a 37% enhancement in test quality with respect to the 39% scan cell observability that a single XOR tree alone provides. In the presence of 10% x's, the scan cell observability of a single XOR tree is more than tripled form almost 9% up to 29%, when the x-align block 10 with a maximum delay of 7 is utilized.

In FIG. 13, the results that demonstrate the high correlation between scan cell observability and fault coverage are presented. In these experiments, 1000 random patterns to the ISCAS benchmark s15850, whose responses are injected x's with a probability of 0.2, are applied. The scan cells are assumed to be organized into 10 scan chains, which drive a single XOR tree.

With respect to FIG. 13, six fault coverage curves are plotted, wherein the underlying fault model is a simple stuck-at model. These curves correspond, in an increasing order from the slowest ramp-up curve to the fastest one, to: (1) solely XOR tree, (2) response shaper+XOR tree, (3) x-align ($\Delta_{max}$=1)+XOR tree, (4) x-align ($\Delta_{max}$=3)+XOR tree, (5) x-align ($\Delta_{max}$=7)+XOR tree, and (6) no response compaction.

In these six schemes, 70, 80, 130, 146, 170, and 547 scan cells on the average per pattern are observed, respectively. As expected, higher scan cell observability yields higher fault coverage. The curve of the response shaper is almost indistinguishable from that of the sole XOR tree, while three x-align curves are visibly separable from the former two, explicitly showing the test quality benefit displayed in the form of fault coverage levels. Upon the application of 1000 random patterns, these six schemes deliver 78.13%, 78.99%, 81.63%, 82.04%, 82.79%, and 86.45% stuck-at coverage levels, respectively.

In order to compare these schemes in terms of test time and data volume, it can be noted that 78.13% coverage level is reached by sole XOR tree after 1000 patterns, by the response shaper after 867 patterns, by x-align ($\Delta_{max}$=1) after 543 patterns, by x-align ($\Delta_{max}$=3) after 477 patterns, and by x-align ($\Delta_{max}$=7) after 460 patterns. In other words, a potential 45.7% reduction in the number of patterns can be reaped by x-align even with its maximum delay constrained to a single cycle, in order to reach the same level of test quality that a sole XOR tree delivers. The penalty imposed by the x-align block 10 with $\Delta$max=1 is twofold.

On additional scan cycle (imposed by the x-align block 10 delay register) per test pattern yields a 1.54% increase in test time as scan depth is increased from 69 to 70. Also, the x-align block 10 uses one scan input channel, which could otherwise be utilized to reduce the depth for 69 down to 63, resulting in a test time penalty (opportunity cost) of 9.52%. This cost can be expected to be much smaller for architectures with a larger number of scan chains. It can be seen that the test pattern count reduction benefit easily overcomes the penalties imposed. In fact, overall there is a 39.7% reduction in test time and the data volume delivered by the x-align block 10 in order to reach the same level of fault coverage.

Cone structure of circuits typically reflects into a clustered distribution of unknown x's in the test responses. The results of the x-align block 10 applied on the test response data of two industrial circuits, both provided by Cadence Design Systems, is provided. Thus, the results help present how the x-align block 10 performs when applied on real test data.

Figure 14A:
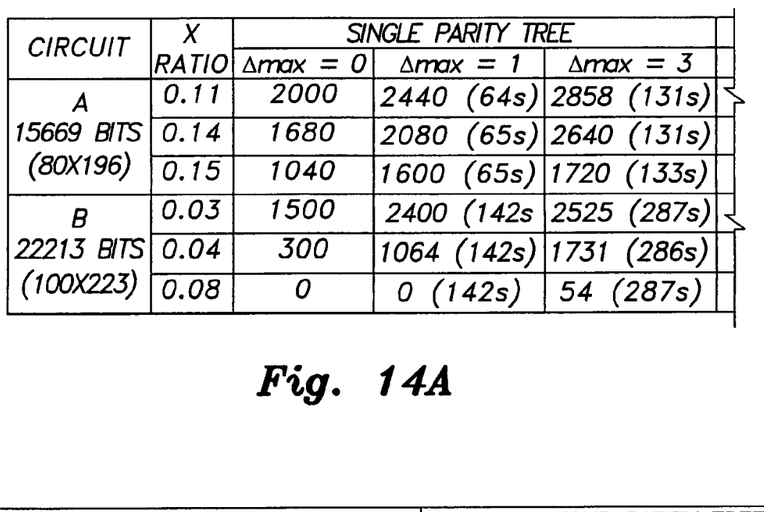
FIGS. 14A and 14B, taken together, are a table that illustrates scan cell observability improvements for industrial circuits with an x-align block and method for increasing scan cell observability of response compactors according to the present invention.
Figure 14B:
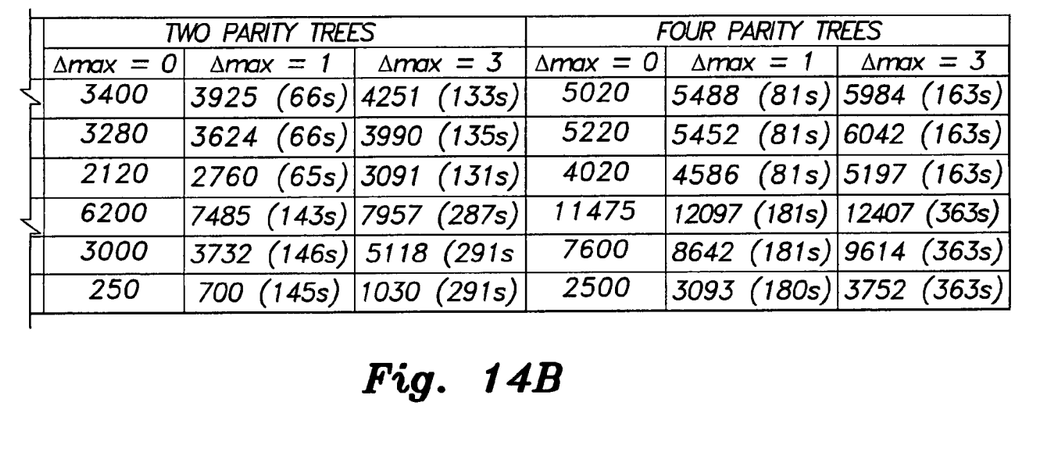

FIGS. 14A and 14B illustrates a table and the first industrial circuit, referred to as A, consists of 15669 scan cells, which are organized into 80 scan chains with a scan depth of 196. The second industrial circuit, denoted as B, consists of 22213 scan cells, organized into 100 scan chains with a depth of 223. Three deterministically generated patterns (that target static faults) are picked randomly, and for each pattern, the x-align block 10 is utilized in conjunction with three different compactors: these are a single parity tree compactor, a compactor that consists of two non-overlapping parity trees, and a compactor that consists of four non-overlapping parity trees. In addition to the scan cell observability and run-time results (in parenthesis) the ratio of x's to the total number of response bits is also provided for each pattern.

It can be seen from the results that even with the clustered distribution of response x's, the x-align block 10 significantly improves the observability of the parity tree compactors. The observability improvement of the x-align block 10 is more accentuated in the cases wherein the response compactors is more aggressive. For instance, for the second pattern of the second circuit, which consists of 4% x's, the observability of a single parity tree, which is originally 300 scan cells, can be improved up to 1064 and 1731 scan cells, when the x-align block 10 with $\Delta_{max}$=1 and $\Delta_{max}$=3 is utilized, respectively.

To summarize, the x-align block 10 can be utilized to benefit from enhanced observability and thus quality, or from reduced test time and data volume, or a combination of both at reasonable costs. The results presented herein reveal that these benefits are magnified for higher response x density, for larger number of scan chains, and for deeper scan chains.

The integration of the x-align hardware into the design flow can be effected seamlessly. The x-align block 10 can be utilized along with any response compactor to improve its test quality further. The results indicate that the utilization of the x-align block 10 along with simple non-overlapping parity trees provides the overall best scan observability levels for x-heavy test responses. Moreover, the enhancement in scan cell observability can also be reaped as test data volume reductions. By adjusting the design parameters of the x-align block 10, the area cost of the x-align block 10 can be directly controlled, resulting in a quite practical and elegant solution for response compaction that can be widely utilized.

While the alignment of x's according to the invention improves the observability of response compactors which compress scan slices independently, other forms of x-alignment can be utilized to improve the observability of response compactors which compress scan chains independently. In the latter type of compaction, alignment of x's in the minimum number of scan chains improves the observability of the response compactor. In that case, the associated x-align circuity consists of multiplexers and is configured with control data that is computed by ILP techniques or greedy heuristics.

It is to be understood that the present invention is not limited to the embodiment described above, but encompasses any and all embodiments within the scope of the following claims.

We claim:

1. A circuit for increasing scan cell observability of a response compactor, comprising:
   an x-align circuit inserted between the response compactor and a plurality of internal scan chains, the scan chains feeding into the x-align circuit, with additional inputs to the x-align circuit being control data, the x-align circuit being configured by the control data for receiving response data from the internal scan chains and manipulating the response data prior to sending the manipulated response data to the response compactor, wherein said x-align circuit includes a plurality of multiplexers, each of the scan chains having a corresponding one of the multiplexers connected thereto, and a plurality of delay registers, at least one of the delay registers being connected in scan-out paths of each of the scan chains between the scan chain and the scan chain's corresponding multiplexer, each of the delay registers delaying the corresponding scan chain for one cycle when enabled by the control data; and
   at least one control register connected to each of the multiplexers, respectively, for determining how many delay registers are inserted on the corresponding scan-out path.

2. The circuit for increasing scan cell observability of a response compactor according to claim 1, further comprising at least one control shift register connected to the at least one control register, the control shift register being operable to receive the control data during shift cycles and to update the control register during a capture cycle.

3. The circuit for increasing scan cell observability of a response compactor according to claim 2, further comprising a delay channel input connected to the control shift register for serially controlling the control shift register, the delay channel input being directly controlled by the control data for enabling an adjustment of the delay of individual scan chains, the control data being serially shifted into the control shift registers and subsequently loaded into the control registers during the capture cycle.

4. The circuit for increasing scan cell observability of a response compactor according to claim 3, further comprising a clock signal circuit connected to the at least one delay register and its corresponding scan chain for generating clock signals, the at least one delay register and its corresponding scan chain being driven by a same one of the clock signals.

5. The circuit for increasing scan cell observability of a response compactor according to claim 4, further comprising a reset input for gating-off a clock input of the control registers and control shift registers.

6. A method for increasing scan cell observability of a response compactor, comprising the steps of:
transforming an input scan response pattern into a map of known and unknown bits, using:

$$T(c, \delta) := \begin{cases} 1 & \text{if } (\delta - \Delta_{max})^{th} \text{ cell of } c^{th} \text{ chain} = x \\ 0 & \text{otherwise} \end{cases}$$

where $0 \leq c < num\_chains$, $0 \leq \delta < depth + 2\Delta_{max}$, num_chains denotes a number of scan chains, x represents unknown response bits, $\Delta_{max}$ represents maximum allowable delay, and depth denotes scan depth;
capturing with matrix T a position of response x's, where 1-entries in the matrix denotes response x's, and 0-entries, denotes known bits; and
defining the matrix T to account for any possible delay of scan chains, in such a way that additional $\Delta_{max}$ leftmost and $\Delta_{max}$ rightmost columns of all 0's pad an actual transformed scan response bits, whereby said method for increasing scan cell observability of response a compactor aligns the x's in a minimum number of scan slices, a minimum number of scan chains, or a minimum number of scan slices and chains, dependent upon the response compactor.

7. The method for increasing scan cell observability of the response compactor according to claim 6, further comprising the step of defining the response compactor with a Boolean function defined as:

$$Drives(c, t) := \begin{cases} 1 & \text{if } c^{th} \text{ chain drives } t^{th} \text{ XOR tree,} \\ 0 & \text{otherwise} \end{cases}$$

where $0 \leq c < num\_chains$, $0 \leq t < num\_trees$, and num_trees denotes a number of XOR trees in the response compactor.

8. The method for increasing scan cell observability of the response compactor according to claim 7, further comprising the step of defining solution variables as a two dimensional binary matrix using:

$$d_{c\delta} := \begin{cases} 1 & \text{if } c^{th} \text{ chain is delayed by } \delta \text{ cycles,} \\ 0 & \text{otherwise} \end{cases}$$

where $0 \leq c < num\_chains$, $0 \leq \delta \leq \Delta_{max}$.

9. The method for increasing scan cell observability of the response compactor according to claim 8, further comprising the steps of:
ensuring a single delay value being assigned for each of the scan chains by:

$$\sum_{\delta=0}^{\Delta_{max}} d_{c\delta} = 1, \forall_{0 \leq c < num\_chains};$$

defining intermediate binary variables $s_{kt}$, to denote whether a scan slice fragment is unobservable as:

$$s_{kt} = \bigvee_{0 \leq c < num\_chains \land Drives(c,t)} \sum_{\delta=0}^{\Delta_{max}} d_{c\delta} \cdot T(c, k+\delta),$$

$$\forall_{0 \leq k < \Delta_{max}+depth} \forall_{0 \leq t < num\_trees}$$

where $s_{kt}$, denotes a fragment of scan cells in a $k^{th}$ scan slice driving a $t^{th}$ XOR tree; and determining the slice fragment being unobservable if any one of the scan cells in the slice fragment has an x in the scan response.

10. The method for increasing scan cell observability of the response compactor according to claim 9, further comprising the steps of:
using the delay of a chain to determine which scan cell on the chain belongs to the $k^{th}$ slice;
multiplying the binary variable $d_{c\delta}$ with the T entry inside the summation;
converting the set of linear constraints by utilizing the following transformation:

$$y = \bigvee_{i=0}^{n-1} a_i \Rightarrow y \leq 1 \text{ and } y \leq \sum_{i=0}^{n-1} a_i \leq n \cdot y$$

which yields $s_{kt} \leq 1$ and $$s_{kt} \leq \sum_{0 \leq c < num\_chains \land Drives(c,t)} \sum_{\delta=0}^{\Delta_{max}} d_{c\delta} \cdot T(c, k+\delta) \leq num\_chains \cdot s_{kt};$$

and
defining an optimization criterion as:

$$\text{minimize} \sum_{t=0}^{num\_trees-1} \cdot \sum_{k=0}^{\Delta_{max}+depth-1} s_{kt},$$

the criterion minimizing the number of unobservable scan slice fragments being targeted.

* * * * *